(12) United States Patent
Lee

(10) Patent No.: US 7,665,915 B2
(45) Date of Patent: Feb. 23, 2010

(54) CAMERA MODULE, METHOD OF MANUFACTURING THE SAME, AND PRINTED CIRCUIT BOARD FOR THE CAMERA MODULE

(75) Inventor: Ju Hyun Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 356 days.

(21) Appl. No.: 11/690,456

(22) Filed: Mar. 23, 2007

(65) Prior Publication Data
US 2007/0223913 A1    Sep. 27, 2007

(30) Foreign Application Priority Data
Mar. 23, 2006    (KR)    ............ 10-2006-0026478

(51) Int. Cl.
*G03B 17/00* (2006.01)
(52) U.S. Cl. .................... 396/529; 396/542
(58) Field of Classification Search ............ 396/529, 396/542; 348/373
See application file for complete search history.

(56) References Cited
U.S. PATENT DOCUMENTS

| | | | |
|---|---|---|---|
| 6,916,685 B2* | 7/2005 | Yang et al. ............... | 438/108 |
| 7,065,869 B2* | 6/2006 | Kang et al. ............... | 29/847 |
| 2006/0098969 A1* | 5/2006 | Asai et al. ............... | 396/89 |
| 2006/0202349 A1* | 9/2006 | Higashida et al. ........ | 257/777 |
| 2007/0122146 A1* | 5/2007 | Ryu ...................... | 396/529 |
| 2007/0269205 A1* | 11/2007 | Lee et al. ................ | 396/542 |
| 2008/0164550 A1* | 7/2008 | Chen et al. .............. | 257/432 |

FOREIGN PATENT DOCUMENTS

JP    04-357683    7/1994

* cited by examiner

*Primary Examiner*—Rodney E Fuller
(74) *Attorney, Agent, or Firm*—Saliwanchik, Lloyd & Saliwanchik

(57) ABSTRACT

A camera module, including a printed circuit board, an image sensor chip, and a housing, is provided. A plating line can be formed in an inner layer of the printed circuit board. A method of manufacturing the camera module can include connecting the plating line of the inner layer of the printed circuit board to a pattern of an outer layer using a via hole, performing a plating process, and forming an image sensor, the housing, and a lens part on the printed circuit board.

14 Claims, 5 Drawing Sheets

CAMERA MODULE, METHOD OF MANUFACTURING THE SAME, AND PRINTED CIRCUIT BOARD FOR THE CAMERA MODULE

CROSS REFERENCE TO RELATED APPLICATION

The present application claims the benefit under 35 U.S.C. §119 to Korean Patent Application No. 10-2006-0026478, filed Mar. 23, 2006, which is hereby incorporated by reference in its entirety.

BACKGROUND

As mobile devices become more miniaturized and multi-functioned, components for communication functions, camera functions, and audio reproduction functions are being modularized and remarkably miniaturized. In particular, mobile devices such as mobile phones and PDAs include a camera function using a compact camera module (CCM).

A CCM includes an image sensor such as a charge coupled device (CCD) and a complementary metal oxide semiconductor (CMOS). The CCM includes a printed circuit board (PCB). The PCB includes the image sensor for converting light energy into electric energy.

FIG. 1 is a front view illustrating a PCB 10 of a conventional camera module.

Referring to FIG. 1, an image sensor 20 is attached to the PCB 10. An electrode pad 22 of the image sensor 20 is connected to an electrode terminal 12 of the PCB 10 using a wire 25. Therefore, the image sensor 20 is electrically connected to the PCB 10, and senses light through a photo detecting area 21.

A plating line 14 is formed in a top layer of the PCB 10. The plating line 14 is electrically connected to the electrode terminal 12. The plating line 14 comes out of the boundary of the PCB. A plating layer is formed on the pattern that needs to be plated by connecting an electrode to the plating line 14. Therefore, a plating layer is formed on the pattern such as the electrode terminal 12.

However, when the boundary of the PCB 10 is cut, an end portion 14' of the plating line 14 is also cut. The cut plating line 14 may cause a burr 17. The burr 17 protrudes from the PCB 10 to deteriorate the appearance of the camera module.

In addition, the burr 17 connected to the plating line 14 may cause a short circuit with other plating lines or other patterns. Therefore, the reliability of the camera module is decreased.

BRIEF SUMMARY

Embodiments provide a camera module including a plating line in an inner layer or an inside of a printed circuit board (PCB), a method of manufacturing the camera module, and a PCB for the camera module.

Embodiments provide a camera module including a plating line of a printed circuit board (PCB) having no or reduced incidence of a burr by connecting the plating line of an inner layer of the PCB to a plating pattern of an outer layer of the PCB using an interlayer connection portion, a method of manufacturing the camera module, and the PCB for the camera module.

An embodiment of the present invention provides a camera module comprising a printed circuit board including at least one plating line in an inner layer, an image sensor mounted on the printed circuit board, a housing fixed to the printed circuit board, and a lens part coupled to the housing.

An embodiment of the present invention provides a printed circuit board for a camera module, the printed circuit board including a line pattern formed in a predetermined layer, at least one plating line formed in at least one inner layer, and at least one via hole connected to a pattern for plating among the plating line and the line pattern.

An embodiment of the present invention provides a method of manufacturing a camera module, the method including: forming a printed circuit board including at least one plating line formed in an inner layer and a line pattern formed in a top layer, connecting the plating line to the line pattern using an interlayer connection portion, forming a pattern protective layer on a region of the line pattern of the top layer except for a plating pattern, connecting an electrode to the plating line so as to form a plating layer on a surface of the plating pattern, mounting an image sensor on the printed circuit board, and fixing a housing including a lens to the printed circuit board.

According to embodiments of the present invention, the camera module can include a PCB including a plating line formed in the inner layer of the PCB. Therefore, the camera module is capable of inhibiting burrs from being generated out of the boundary of the PCB and causing a short circuit with other patterns.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
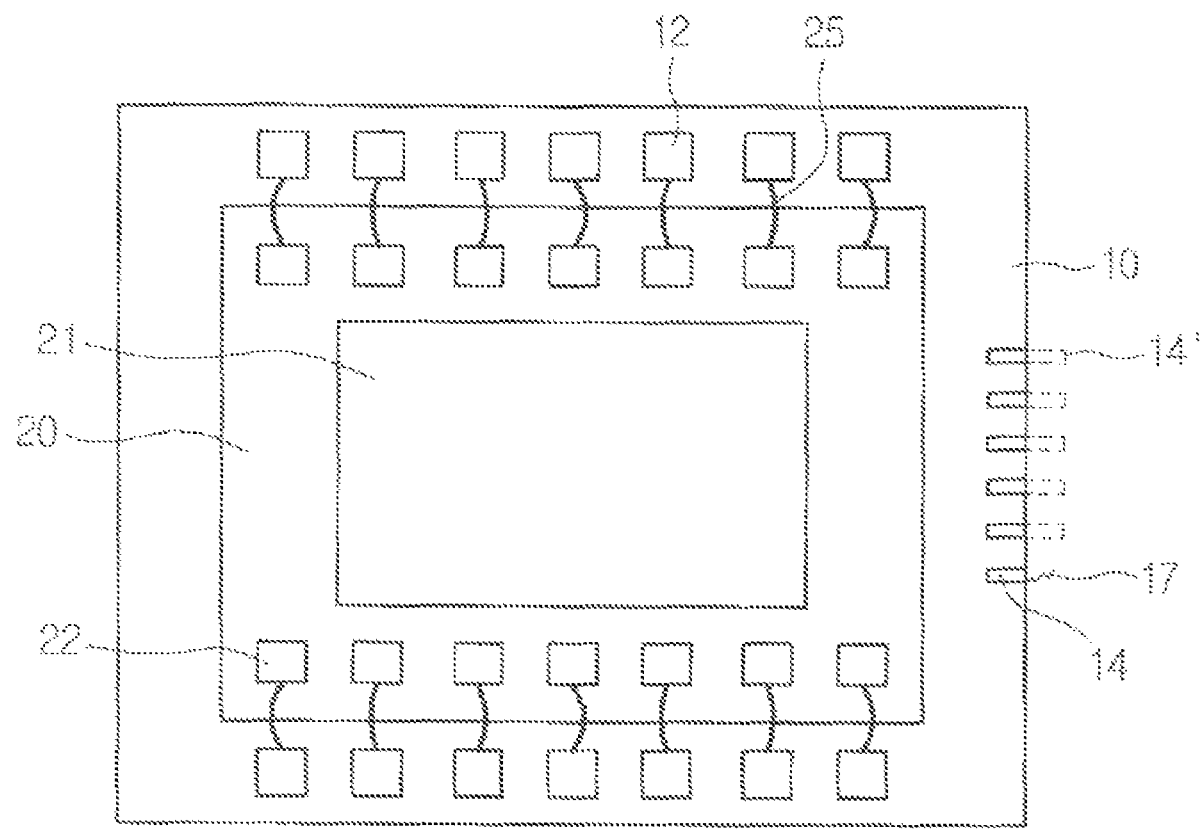
FIG. 1 is a front view illustrating a conventional printed circuit board.
Figure 2:
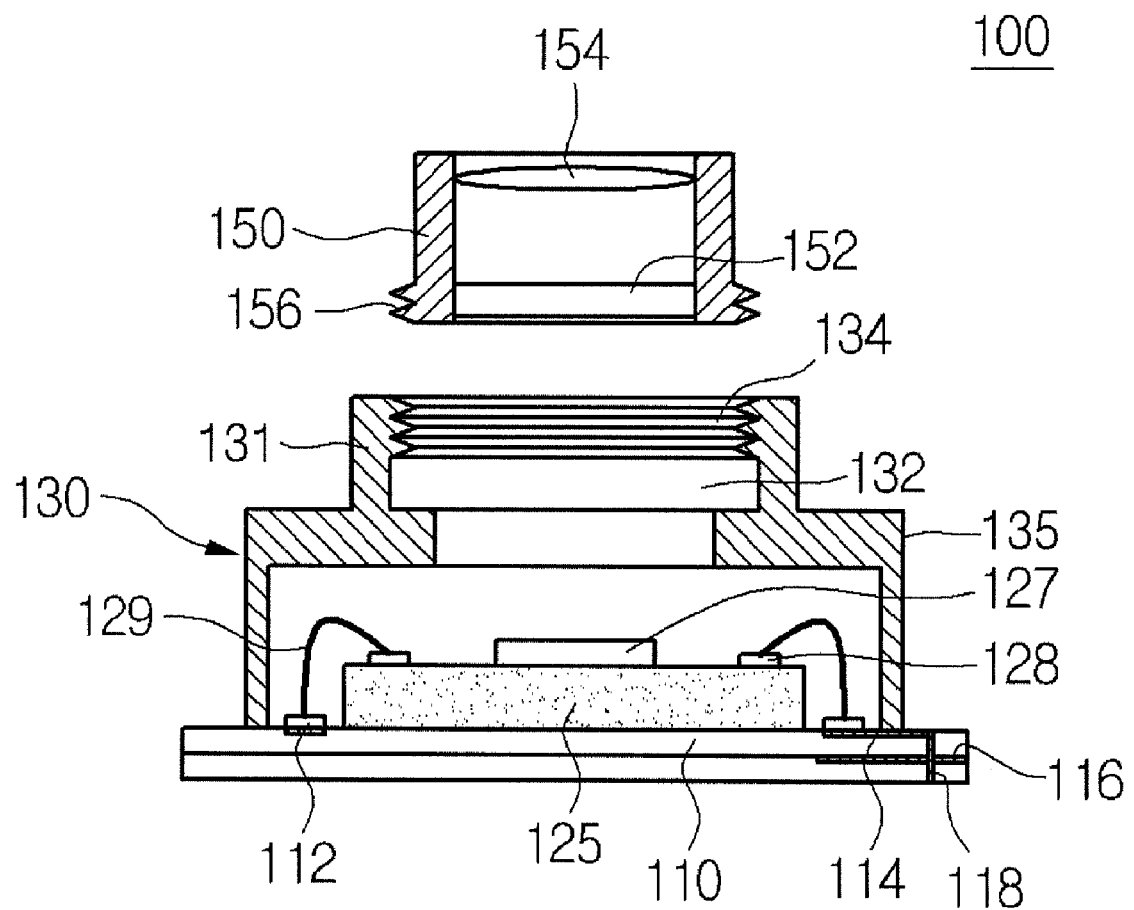
FIG. 2 is a cross-sectional view illustrating a camera module according to an embodiment of the present invention.

FIG. 2 is a cross-sectional view illustrating a camera module 100 according to an embodiment.

Referring to FIG. 2, the camera module 100 can include a printed circuit board 110, an image sensor 125, a housing 130, and a lens barrel 150.

The printed circuit board 110 can be a multi-layer printed circuit board on which a plurality of copper foils are stacked. In embodiments, the printed circuit board 110 may be a rigid printed circuit board (PCB) or a flexible printed circuit board (FPCB).

The printed circuit board 110 can include an electrode terminal 112, plating lines 116, and via holes 118. The electrode terminal 112 can be formed in a top layer of the printed circuit board 110. The plating line 116 can be formed in an inner layer of the printed circuit board 110. The via hole 118 vertically goes through the printed circuit board 110 and electrically connects the plating line 116 of the inner layer to the electrode terminal 112 of the top layer.

The electrode 112 of the printed circuit board 110 can be a pad. The pad can be formed by plating a pattern 113 that needs to be plated (hereinafter plating pattern) among line patterns 111B with gold and/or nickel. The via hole 118 can be an interlayer connection portion. The interlayer connection portion may also be a via. A passive element can be mounted to the printed circuit board 110 using a surface mount technology (SMT).

For example, the image sensor 125 may be a charge coupled device (CCD) or a complementary metal oxide semiconductor (CMOS). The image sensor 125 can include a semiconductor chip structure such as, for example, a ball grid array (BGA), a chip scale (size) package (CSP), or a chip on board (COB). Embodiments of the present invention will be described with reference to the COB type image sensor that needs a wire bonding, but the invention is not limited thereto.

Many sensor devices for responding to light can be stacked on a sensing region 127 of the image sensor 125. A plurality of electrode pads 128 can be formed on the edge of the image sensor 125.

The image sensor 125 can be bonded to the printed circuit board 110 using a non-conductive adhesive. The non-conductive adhesive may be epoxy or silicon.

The electrode pad 128 of the image sensor 125 can be connected to the electrode terminal 112 of the printed circuit board 110 using a wire 129.

The housing 130 seals the surroundings of the image sensor 125 and provides an optical path to the image sensor 125. A light guide portion 131 can be formed on an upper portion of the housing 130, and a support portion 135 can be formed on a lower portion of the housing 130.

The support portion 135 of the housing 130 can be bonded to the epoxy applied to the printed circuit board 110. The epoxy can be cured at a predetermined temperature to fix the housing 130 to the printed circuit board 110.

The lens barrel 150 can be coupled to an inner surface 132 of the light guide portion 131 of the housing 130. For example, a housing thread 134 can be formed in the inner surface 132 of the light guide portion 131 of the housing 130, and a lens barrel thread 156 can be formed in an outer surface of the lens barrel 150. Accordingly, the lens barrel 150 can be coupled to the inner surface 132 of the light guide portion 131 using the threads 134 and 156.

The lens barrel 150 may have a barrel shaped frame and can include a filter 152 and a lens 154. The filter 152 may be an infrared glass filter or an infrared cut filter. The filter 152 may be located between the image sensor 125 and the lens 154. The lens 154 can include one or more lenses, and condenses the induced light on to the sensing region 127.

Various variations and modifications are possible for coupling or attaching the image sensor 125 on the printed circuit board 110, the housing 130, and the lens barrel 150 of the camera module 100.

Figure 3:
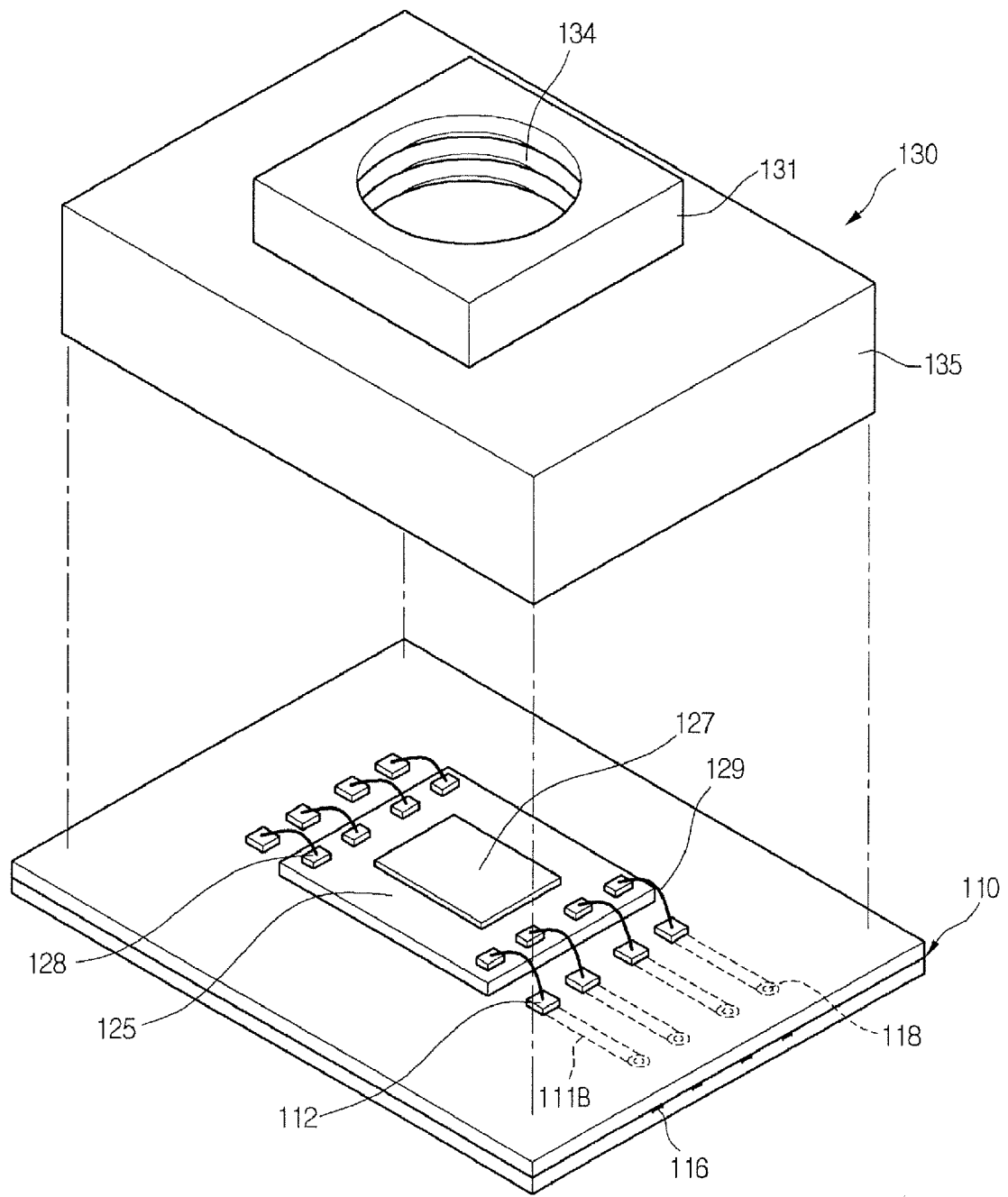
FIG. 3 is an exploded perspective view illustrating a camera module according to an embodiment of the present invention.

FIG. 3 is an exploded perspective view illustrating a camera module according to an embodiment.

Referring to FIG. 3, the electrode terminal 112 of the printed circuit board 110 can be formed to correspond to the electrode pad 128 of the image sensor 125.

In addition, the electrode terminal 112 may be directly connected to the via hole 118 or connected to the via hole 118 through the line pattern 111B. The via hole 118 can be connected to the plating line 116 formed in the inner layer or the inside of the printed circuit board 110. Therefore, the electrode terminal 112 of the printed circuit board 110 can be connected to the plating line 116 formed in the inner layer through the via hole 118.

Figure 4:
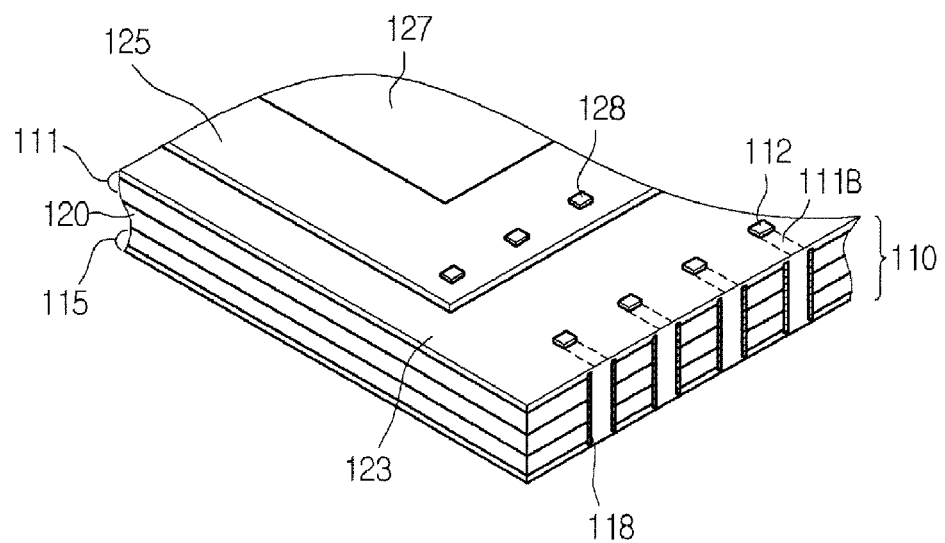
FIG. 4 is a partial perspective view illustrating a printed circuit board according to an embodiment of the present invention.
Figure 5:
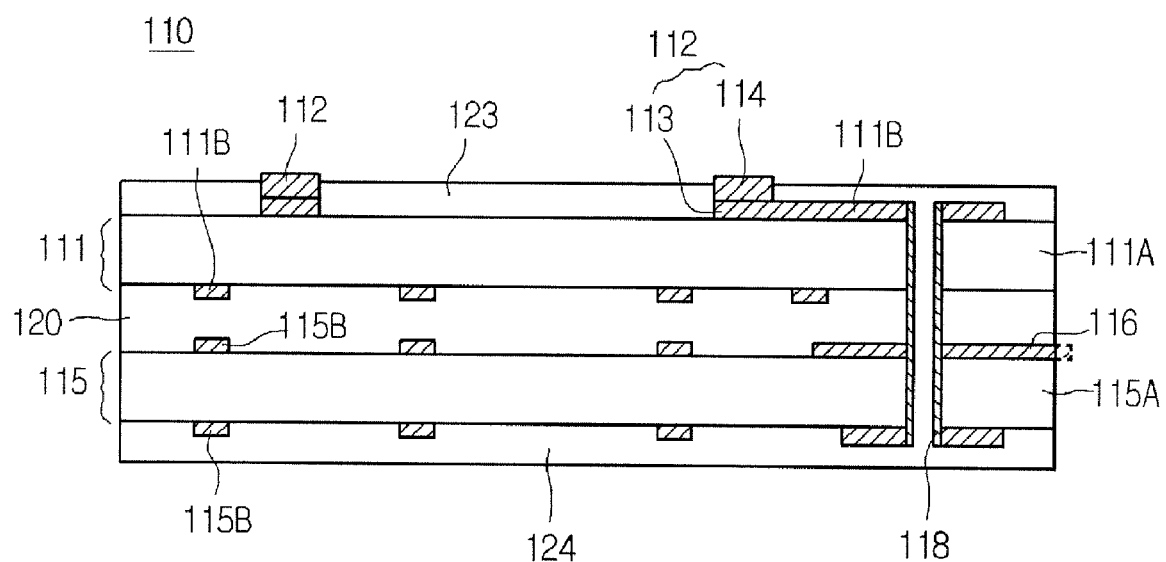
FIG. 5 is a cross sectional view illustrating a printed circuit board according to an embodiment of the present invention.

FIG. 4 is a partial perspective view illustrating a printed circuit board 110 according to an embodiment. FIG. 5 is a cross sectional view illustrating a printed circuit board 110 according to an embodiment. Here, the printed circuit board 110 can include two substrates.

Referring to FIGS. 4 and 5, an upper substrate 111 can be formed at an upper portion of the printed circuit board 110, and a lower substrate 115 can be formed at a lower portion of the printed circuit board 110. A bonding sheet 120 can be formed between the upper substrate 111 and the lower substrate 115.

The upper substrate 111 and/or the lower substrate 115 may be a copper clad laminate (CCL). A CCL includes a copper foil stacked on one side or the both sides of an insulating layer 111A and/or 115A. The insulating layers 111A and 115A may be formed of epoxy, resin, or polyimide. The bonding sheet 120 may be formed of a prepreg material or an adhesive film.

The line patterns 111B and 115B can be formed in the upper substrate 111 and the lower substrate 115. For example, a dry film can be pressed on the copper foil of the printed circuit board 110, and then an artwork film including a predetermined line pattern can be put on the dry film. After that, an ultraviolet exposure can be performed on the dry film. Next, the dry film can be developed using a predetermined developer, and then a copper foil which the dry film does not cover can be removed. Subsequently, the dry film can be removed to form the line patterns 111B and 115B on the upper and the lower substrate 111 and 115.

The line pattern 111B of a top layer of the upper substrate 111 can include the plating pattern 113 to be plated. The line pattern 115B of a top layer of the lower substrate 115 can include one or more plating lines 116.

In addition, a plating line 116 may be formed on the line pattern 111B of a bottom layer of the upper substrate 111 and/or the line pattern 115B of the top layer of the lower substrate 115. One or more of the plating lines 116 can be formed in at least one layer among the inner layers of the multi-layer printed circuit board.

In addition, the bottom layer of the upper substrate 111 and the top layer of the lower substrate 115 can be bonded to the both sides of the bonding sheet 120 and pressed to form a multi-layer printed circuit board. The plating line 116 comes out of the boundary of the printed circuit board 110 to be connected to an outside connector.

According to these embodiments, the top layer of the printed circuit board 110 is the top layer of the upper substrate 111. A bottom layer of the printed circuit board 110 is a bottom layer of the lower substrate 115. The inner layer of the printed circuit board 110 is the bottom layer of the upper substrate 111 and the top layer of the lower substrate 115.

One or more of the via holes 118 can be formed in the printed circuit board 110. The via hole 118 can be formed by a drill or a laser beam. An inner surface of the via hole 118 can be plated (e.g., brass plating). The plating pattern 113 of the upper substrate 111 can be electrically connected to the plating line 116 of the lower substrate 115 by the via hole 118.

The plating line 116 formed in the inner layer of the printed circuit board 110 can be connected to the plating pattern 113 through one or more of the via holes 118 and at least one line pattern.

Pattern protective layers 123 and 124 can be formed at the top and bottom layers of the printed circuit board 110. The pattern protective layers 123 and 124 can be a photo solder resist (PSR) layer. The pattern protective layers 123 and 124 can be formed on the whole region of the printed circuit board 110 except for the plating pattern 113 and thus protect the line patterns 111B and 115B. The plating pattern 113 can be exposed through an outer layer of the printed circuit board 110.

A plating layer 114 can be formed on the plating pattern 113 exposed from the upper substrate 111. The plating layer 114 can be formed by an electroplating process.

According to an electroplating process, the printed circuit board 110 can be immersed in a plating bath, and then current can flow from a cathode to the printed circuit board 110 through the plating line 116 formed on the lower substrate 115. That is, the current flows from the cathode to the plating pattern 113 of the upper substrate 111 through the plating line 116 and the via hole 118. Therefore, a plating layer 114 having a predetermined thickness can be formed on the surface of the plating pattern 113. The plating layer 114 is formed on the plating pattern 113 to function as an electrode terminal 112.

The plating layer 114 formed on the surface of the plating pattern 113 can be a metal having high electric conductivity and oxidation-resisting properties. For example, the plating layer 114 may be a metal formed of an alloy of Au, Sn, Ag, and SnPb, or an alloy of Ni and AuNi. The thickness of the plating layer 114 can be larger than the minimum thickness (e.g., 5000 Å) preventing the electrode terminal 112 from being damaged when bonding a wire. The minimum thickness guarantees electrical reliability.

The image sensor 125 can be mounted on the printed circuit board 110. For example, the image sensor 125 can be bonded to the printed circuit board 110 using a non-conductive adhesive. The electrode pad 128 of the image sensor 125 can be connected to the electrode terminal 112 of the printed circuit board 110 using a wire. Then, the housing 130 and the lens barrel 150 can be coupled to the printed circuit board 110 including the image sensor 125 to form the camera module.

The boundary of the printed circuit board 110 can be cut by a routing process. The boundary corresponds to the size of the camera module. The plating line 116 of the printed circuit board 110 is formed in the inner layer and bonded to the bonding sheet 120. Therefore, although the printed circuit board 110 is cut, the plating line 116 has no burr. In addition, the surface of the plating line 116 of the inner layer of the printed circuit board 110 does not oxidize and does not cause an external short circuit.

In addition, the plating line 116 of the top layer of the printed circuit board 110 can be removed to increase a region for forming the line patterns 111B and 115B or reduce the size of the printed circuit board 110.

Figure 6:
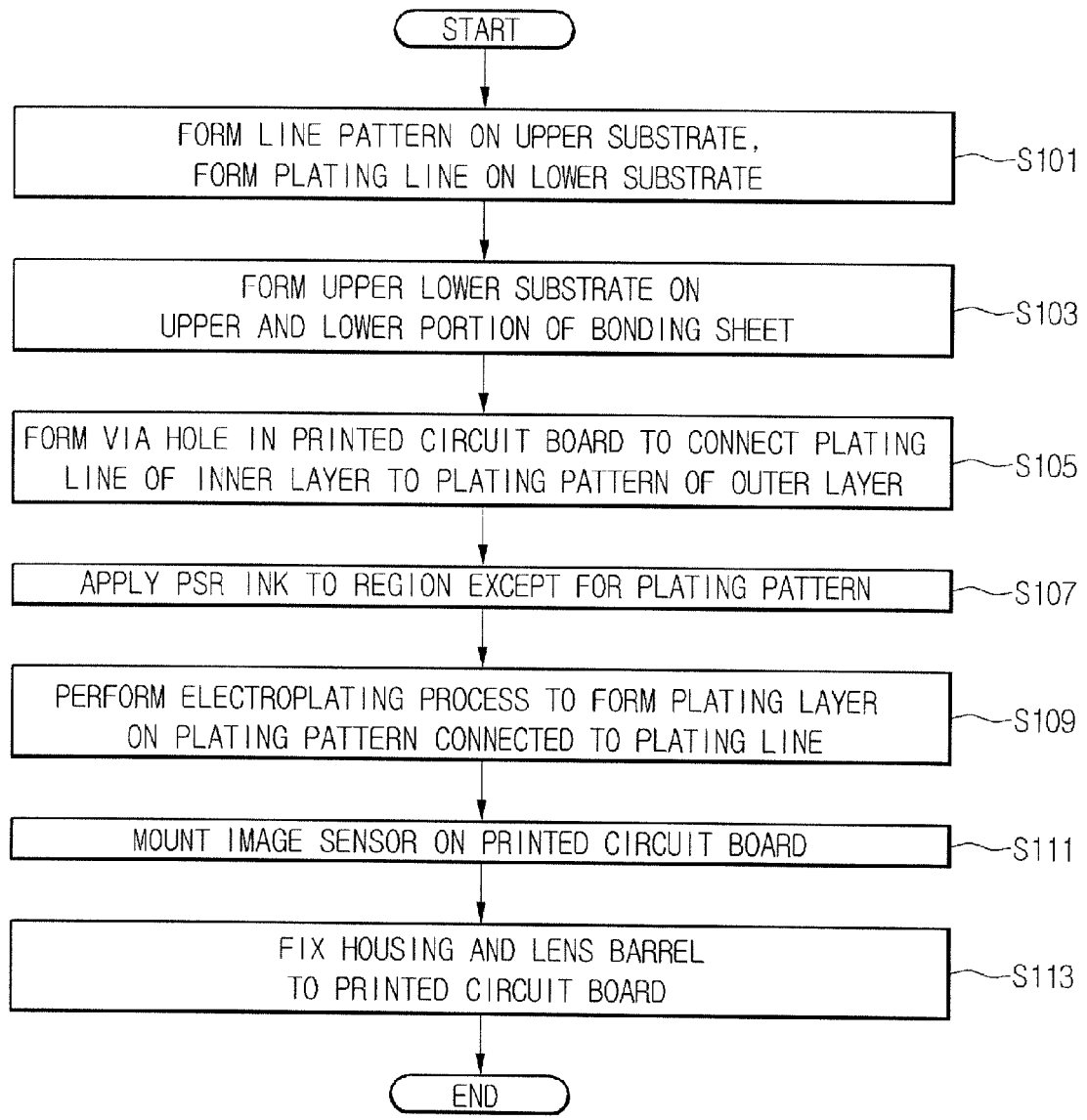
FIG. 6 is a flowchart illustrating a method of manufacturing a camera module according to an embodiment of the present invention.

FIG. 6 is a flowchart illustrating a method of manufacturing a camera module according to an embodiment.

Referring to FIG. 6, a line pattern can be formed on upper and lower substrates. A pattern to be plated can be formed in a top layer of the upper substrate, and a plating line can be formed in a top layer of the lower substrate (S101).

The upper and lower substrates can be formed on an upper and lower portion of a bonding sheet, respectively (S103). As a result, a multi-layer printed circuit board is completed. The plating line can be formed in an inner layer of the printed circuit board, and the pattern to be plated can be formed in a top layer of the printed circuit board.

A via hole can be formed in the printed circuit board, which electrically connects the plating line to the plating pattern (S105). The via hole can be connected to the plating line or the plating pattern directly or through other line patterns.

In addition, as a pattern protective layer, a photo solder resist (PSR) ink can be applied to the printed circuit board (S107). The pattern protective layer protects the line pattern except for the plating pattern from environments.

Then, an electroplating process can be performed (S109). According to an electroplating process, current flows from a cathode to the via hole connected to the plating line and the plating pattern through the plating line. As a result, a thin metal plating layer can be formed on the plating pattern of the printed circuit board.

After that, an image sensor can be mounted on the printed circuit board (S111). The image sensor can be bonded to the printed circuit board and connected to the printed circuit board using, for example, a wire.

A housing can be fixed to an upper portion of the printed circuit board to surround an image sensor chip. A lens barrel including at least one lens and at least one filter can be coupled to an upper portion of the housing (S113).

After the image sensor chip, the housing, and the lens barrel are coupled to the printed circuit board, the boundary of the printed circuit board can be cut. The boundary corresponds to the size of a camera module. Since the plating line is formed in the inner layer of the printed circuit board and bonded to the bonding sheet, the plating line has no burr.

In addition, since the plating line has no burr, the electrical reliability of a product is improved. In addition, the plating line of the top layer of the printed circuit board can be removed to increase a region for forming the line pattern or reduce the size of the camera module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the components parts and/or arrangements, alternative uses will also be apparent to those skilled in the art.

What is claimed is:

1. A camera module comprising:
   a printed circuit board comprising at least one plating line at an inner surface, an electrode terminal of an outer layer of the printed circuit board, and a via hole connected to a selected plating line of the at least one plating line and the electrode terminal;
an image sensor mounted to the printed circuit board;
a housing fixed to the printed circuit board; and
a lens part coupled to the housing,
wherein the selected plating line extends from the via hole continuously along the inner surface to be exposed at a side surface of the printed circuit board to be connected to an outside entity.

2. The camera module according to claim 1, wherein an end portion of the via hole is connected to a pattern connected to the electrode terminal.

3. The camera module according to claim 1, wherein the via hole is formed in whole layers or some layers of the printed circuit board.

4. The camera module according to claim 1, wherein the printed circuit board is formed of a multi-layer printed circuit board, and the at least one plating line is formed in at least one inner layer of the printed circuit board.

5. The camera module according to claim 1, wherein the lens part comprises a lens barrel including at least one lens and at least one filter.

6. A printed circuit board for a camera module, the printed circuit board comprising:
a line pattern formed in at least one outer layer;
at least one plating line formed in at least one inner layer; and
at least one via hole connected to a pattern for plating among the plating line and the line pattern,
wherein a selected plating line of the at least one plating line extends from the via hole continuously along the inner layer to be exposed at a side surface of the printed circuit board to be connected to an outside entity.

7. The printed circuit board according to claim 6, wherein the at least one via hole is formed in whole layers or some layers of the printed circuit board.

8. The printed circuit board according to claim 6, wherein the plating line is bonded to a bonding sheet provided in the inner layer of the printed circuit board.

9. A method of manufacturing a camera module, the method comprising:
forming a printed circuit board comprising at least one plating line formed in an inner surface and a line pattern formed in a top layer;
connecting a selected plating line of the at least one plating line to the line pattern using a via hole;
forming a pattern protective layer on a region of the line pattern of the top layer except for a plating pattern;
connecting an electrode to the selected plating line so as to form a plating layer on a surface of the plating pattern;
mounting an image sensor on the printed circuit board; and
fixing a housing comprising a lens to the printed circuit board,
wherein the selected plating line extends from the via hole continuously along the inner surface to be exposed at a side surface of the printed circuit board to be connected to an outside entity.

10. The method according to claim 9, wherein the printed circuit board comprises at least two substrates bonded to a bonding sheet, the substrates including the line pattern formed on at least one surface thereon.

11. The method according to claim 9, wherein the at least one plating line is formed in at least one inner layer of the printed circuit board.

12. The method according to claim 9, wherein the plating layer is formed by an electroplating process.

13. The method according to claim 9, wherein the mounting of the image sensor comprises:
bonding the image sensor to the top layer of the printed circuit board; and
connecting an electrode pad of the image sensor to a plating pattern of the plating layer using a wire.

14. The method according to claim 9, wherein the plating layer is formed of an alloy of Au, Sn, Ag, and SnPb, or an alloy of Ni and AuNi.

* * * * *